(12) United States Patent
Kuboki et al.

(10) Patent No.: US 9,713,260 B2
(45) Date of Patent: Jul. 18, 2017

(54) ELECTRONIC CIRCUIT DEVICE AND METHOD FOR MANUFACTURING SAME

(71) Applicant: KEIHIN CORPORATION, Shinjuku-ku, Tokyo (JP)

(72) Inventors: Tadao Kuboki, Tochigi (JP); Satoshi Sakai, Tochigi (JP)

(73) Assignee: Keihin Corporation, Tokyo (JP)

( * ) Notice: Subject to any disclaimer, the term of this patent is extended or adjusted under 35 U.S.C. 154(b) by 97 days.

(21) Appl. No.: 14/766,265

(22) PCT Filed: Dec. 24, 2013

(86) PCT No.: PCT/JP2013/084493
§ 371 (c)(1),
(2) Date: Aug. 6, 2015

(87) PCT Pub. No.: WO2014/122867
PCT Pub. Date: Aug. 14, 2014

(65) Prior Publication Data
US 2015/0382470 A1 Dec. 31, 2015

(30) Foreign Application Priority Data

Feb. 8, 2013 (JP) ................. 2013-023387

(51) Int. Cl.
*H05K 1/18* (2006.01)
*B29C 45/14* (2006.01)
(Continued)

(52) U.S. Cl.
CPC ....... *H05K 1/185* (2013.01); *B29C 45/14065* (2013.01); *B29C 45/14639* (2013.01);
(Continued)

(58) Field of Classification Search
CPC .......... H05K 1/185; H05K 3/284; H05K 3/30; H05K 3/4644; H05K 1/117;
(Continued)

(56) References Cited

U.S. PATENT DOCUMENTS

| 7,514,784 B2 | 4/2009 | Mayuzumi et al. |
| 7,568,942 B1 * | 8/2009 | Lannon ............... H01R 13/5213 439/136 |
| 2011/0228467 A1 * | 9/2011 | Mitsuhashi ............ H05K 1/117 361/679.32 |

FOREIGN PATENT DOCUMENTS

| JP | 05-275838 A | 10/1993 |
| JP | 07-106045 A | 4/1995 |

(Continued)

*Primary Examiner* — Eric Thomas
*Assistant Examiner* — Michael P McFadden
(74) *Attorney, Agent, or Firm* — Carrier Blackman & Associates, P.C.; William D. Blackman; Jingli Wang

(57) ABSTRACT

An electronic circuit device which forms a parting line preventing the penetration of moisture into a connector and a manufacturing method thereof are provided. The electronic, circuit device (1) includes resin sealing members (6, 7) that seal a circuit substrate (2) having electronic components (4) mounted and a terminal section (5) formed at one end portion. The resin sealing member (6) includes a parting line (9) formed extending around an axis of an insertion direction of the terminal section (5). The electronic circuit device (1) is manufactured using a metal mold apparatus (21) formed by an upper die (22) including a first hollow portion (24) having a shape following the external appearance of a half part (6) of the resin sealing member and a lower die (23) including a second hollow portion (27) having a shape following the external appearance of a half part (7) of the resin sealing member.

8 Claims, 4 Drawing Sheets

(51) Int. Cl.
*H05K 3/28* (2006.01)
*H05K 3/30* (2006.01)
*H05K 3/46* (2006.01)
B29L 31/36 (2006.01)
H05K 1/11 (2006.01)

(52) U.S. Cl.
CPC ............... *H05K 3/284* (2013.01); *H05K 3/30* (2013.01); *H05K 3/4644* (2013.01); *B29L 2031/36* (2013.01); *H05K 1/117* (2013.01); *H05K 2203/1316* (2013.01); *H05K 2203/1327* (2013.01)

(58) Field of Classification Search
CPC ...... H05K 2203/1316; B29C 45/14065; B29C 45/14639; B29L 2031/36
USPC ......................................................... 361/761
See application file for complete search history.

(56) References Cited

FOREIGN PATENT DOCUMENTS

| | | | |
|---|---|---|---|
| JP | 07-122342 A | 5/1995 |
| JP | 07-211403 A | 8/1995 |
| JP | 09-055254 A | 2/1997 |
| JP | 10-076528 A | 3/1998 |
| JP | 2002-127188 A | 5/2002 |
| JP | 4478007 B2 | 6/2010 |

\* cited by examiner

WIDTHWISE DIRECTION OF CIRCUIT SUBSTRATE

THICKNESS DIRECTION OF CIRCUIT SUBSTRATE

PRIOR ART

ELECTRONIC CIRCUIT DEVICE AND METHOD FOR MANUFACTURING SAME

TECHNICAL FIELD

The present invention relates to an electronic circuit device and a method for manufacturing the electronic circuit device.

BACKGROUND ART

Conventionally, for example, module-type electronic circuit devices are used in card edge-type engine control units (ECU) of motorcycles and the like. As the electronic circuit devices, for example, electronic circuit devices each including a circuit substrate that has electronic components mounted thereon and has one end portion in which a terminal section is formed and a resin sealing member that seals the circuit substrate with the terminal section being exposed are known (for example, see Patent Document 1).

By inserting the terminal section into an insertion port of a connector and connecting the terminal section to a connector-side terminal section, such an electronic circuit device is used. In the electronic circuit device, when the terminal section is inserted into the insertion port, the resin sealing member is brought into contact with a sealing member arranged over the whole periphery of the insertion port. At this time, the sealing member is brought into tight contact with the whole periphery of the resin sealing member, thereby blocking the penetration of external moisture to the inside of the connector.

The electronic circuit device, as illustrated in FIG. 4, is manufactured by arranging the circuit substrate 2 inside a cavity portion 32 of a metal mold apparatus 31 and filling the cavity portion 32 with a resin. The metal mold apparatus 31 is formed by an upper die 33 and a lower die 34. The upper die 33 includes: a first hollow portion 35 having a shape following an outer shape of the tipper half part of the resin sealing member; and a second hollow portion 36 that is arranged to be connected to the first hollow portion 35 and houses the upper half part of the terminal section 5. In addition, the lower die 34 includes: a third hollow portion 37 having a shape following an outer shape of the lower half part of the resin sealing member; and a fourth hollow portion 38 that is arranged to be connected to the third hollow portion 37 and houses the lower half part of the terminal section 5.

The circuit substrate 2 is arranged inside the cavity portion 32 in a state in which an O-ring 10 is fitted to the boundary portion between a portion in which electronic components 4 are mounted and the terminal section 5. In such a case, the O-ring 10 is brought into tight contact with the upper die 33 on the boundary portion between the first hollow portion 35 and the second hollow portion 36 and is brought into tight contact with the lower die 34 on the boundary portion between the third hollow portion 37 and the fourth hollow portion 38. As a result, the cavity portion 32 is formed by the first hollow portion 35, the third hollow portion 37, and the O-ring 10. In addition, while the terminal section 5 is arranged inside a space 39 that is formed by the second hollow portion 36 and the fourth hollow portion 38, the O-ring 10 arranged between the space 39 and the cavity portion 32 blocks the penetration of a resin into the space 39, and accordingly, the terminal section 5 is not sealed with the resin.

The electronic circuit device can be acquired by opening the metal mold apparatus 31 and extracting the electronic circuit device after the resin filled in the cavity portion 32 is solidified. At this time, the O-ring 10 is bonded to the solidified resin. In addition, in the electronic circuit device, as a trace of the boundary between the upper die 33 and the lower die 34, a parting line is formed along the side face of the circuit substrate 2.

CITATION LIST

Patent Document

Patent Document 1: Japanese Patent No. 4478007

DISCLOSURE OF THE INVENTION

Problem to be Solved by the Invention

However, in the conventional electronic circuit device described above, since the parting line is formed along the side face of the circuit substrate, there is an inconvenience that external moisture may penetrate into the inside of the connector when the electronic circuit device is inserted into the insertion port of the connector, in other words, when the conventional electronic circuit device described above is inserted into the insertion port of the connector, and the sealing member is brought into tight contact with the whole periphery of the resin sealing member, the sealing member traverses the parting line. As a result, a gap is generated between the sealing member and the resin sealing member, and there is concern that the moisture penetrates into the inside of the connector from the gap.

In addition, in the conventional electronic circuit device described above, it is necessary to fit the O-ring to each of the circuit substrate at the manufacturing time, and the O-ring forms a part of the electronic circuit device of a product, whereby there is also an inconvenience that the manufacturing cost increases.

An object of the present invention is to provide an electronic circuit device, which resolves such inconveniences, capable of forming a parting line not causing external moisture to penetrate into the inside of the connector when the electronic circuit device is inserted into the insertion on of the connector and capable of reducing the manufacturing cost, and a manufacturing method thereof.

Means for Solving Problem

In order to achieve such an object, according to the present invention, there is provided an electronic circuit device including: a circuit substrate in which electronic components are mounted, and a terminal section is formed in an end portion of a predetermined direction; and a resin sealing member that seals the circuit substrate with the terminal section being exposed, the resin sealing member having a sealing thee that extends around an axis of a predetermined direction and is brought into contact with an entire periphery of an inner circumferential thee of an insertion port of a connector into which the terminal section is inserted through a sealing member, the resin sealing member including a parting line that is formed to extend around the axis of the predetermined direction.

In the present invention, a direction in which the circuit substrate is inserted into the insertion port of the connector is defined as the "predetermined direction".

In the electronic circuit device according to the present invention, the resin sealing member includes the parting line that is formed to extend around the axis of the predetermined direction. Thus, when the terminal section is inserted into the insertion port of the connector and is connected to the connector-side terminal section, the sealing member is reliably brought into tight contact with the entire periphery of the resin sealing member without traversing the parting line. As a result, according to the electronic circuit device of the present invention, the parting line can be formed so as not to cause external moisture to penetrate into the inside of the connector when the terminal section is inserted into the insertion port of the connector.

In the electronic circuit device according to the present invention, it is preferable that the parting line be located at a position different from the sealing face. Accordingly, since the sealing member does not traverse the parting line, a contact area between the resin sealing member and the sealing member can be sufficiently secured, and the penetration of external moisture into the inside of the connector can be prevented more effectively.

In addition, in the electronic circuit device according to the present invention, it is preferable that the sealing face be molded by using a single metal mold. In such a case, the sealing face not having a parting line can be reliably molded.

In addition, in the electronic circuit device according to the present invention, it is preferable that the sealing face is configured to include a first face pointing to an outer peripheral side about the axis of the predetermined direction, and the resin sealing member is configured to include a second thee which contacts with an end edge of the first face disposed on the opposite side of the predetermined direction and points to the predetermined direction. In such a case, in the state in which the terminal section is connected to the connector-side terminal section, at least a part of the sealing member seen from the predetermined direction is hidden by the second face. Thus, for example, even when cleaning water is released from a side opposite to the predetermined direction, it can be prevented that the sealing member is peeled off from the first face due to the force of the water, and the water penetrates between the sealing member and the first face, or the sealing member is damaged due to the influence of the water.

Furthermore, according to the present invention, there is provided a method for manufacturing an demonic circuit device including: a circuit substrate in which electronic components are mounted, and a terminal section is formed in an end portion of a predetermined direction; and a resin sealing member that seals the circuit substrate with the terminal section being exposed, the resin sealing member including parting line that is formed to extend around an axis of a predetermined direction, the resin sealing member having a sealing face that extends around the axis of the predetermined direction and is brought into contact with an entire periphery of an inner circumferential face of an insertion port of a connector into which the terminal section is inserted through a sealing member, the method including: inserting the circuit substrate into a second die in a state in which a first die and the second die are open and supporting the circuit substrate to be in a state in which an end portion of the circuit substrate disposed on a side opposite to the predetermined direction points to the first die by using a metal mold apparatus comprising the first die that includes a first hollow portion having a shape following an external appearance of a half part of the resin sealing member that is disposed on a side opposite to the predetermined direction and the second die that includes a second hollow portion having a shape following an external appearance of a half part of the resin sealing member, which includes the sealing face, of the predetermined direction and is configured by a single metal mold; forming a cavity portion that is formed by the first hollow portion and the second hollow portion by clamping the first die and the second die; filling the cavity portion with a resin; and opening the first die and the second die after the resin is solidified and extracting the electronic circuit device.

In the method for manufacturing the electronic circuit device according to the present invention, first, the circuit substrate is inserted into the second die in a state in which the first die and the second die of the metal mold apparatus are open, and the circuit substrate is supported to be in a state in which an end portion of the circuit substrate disposed on a side opposite to the predetermined direction points to the first die.

Next, when a cavity portion that is formed by the first hollow portion and the second hollow portion is formed by clamping the first die and the second die, the circuit substrate is arranged inside the cavity portion in a state in which an end portion disposed on the side opposite to the predetermined direction points to the first die.

Next, the cavity portion is filled with a resin. As a result, the electronic circuit device that is in a state in which the terminal section is exposed from the resin sealing member can be acquired.

In addition, at this time, the first die includes the first hollow portion having a shape following the external appearance of the half part of the resin scaling member that is disposed on a side opposite to the predetermined, direction, and the second die includes the second hollow portion having a shape following the external appearance of the half part of the resin sealing member of the predetermined direction. As a result, the parting line extending around the axis of the predetermined direction can be formed on the boundary between the first die and the second die.

Next, after the resin is solidified, the first die and the second die are opened, and the electronic circuit device is extracted. According to the manufacturing method of the present invention, a support member such as an O-ring does not need to be fitted to each circuit substrate, and accordingly, the manufacturing cost can be reduced.

MODE(S) FOR CARRYING OUT THE INVENTION

Next, an embodiment of the present invention will be described in more detail with reference to the accompanying drawings.

Figure 1A:
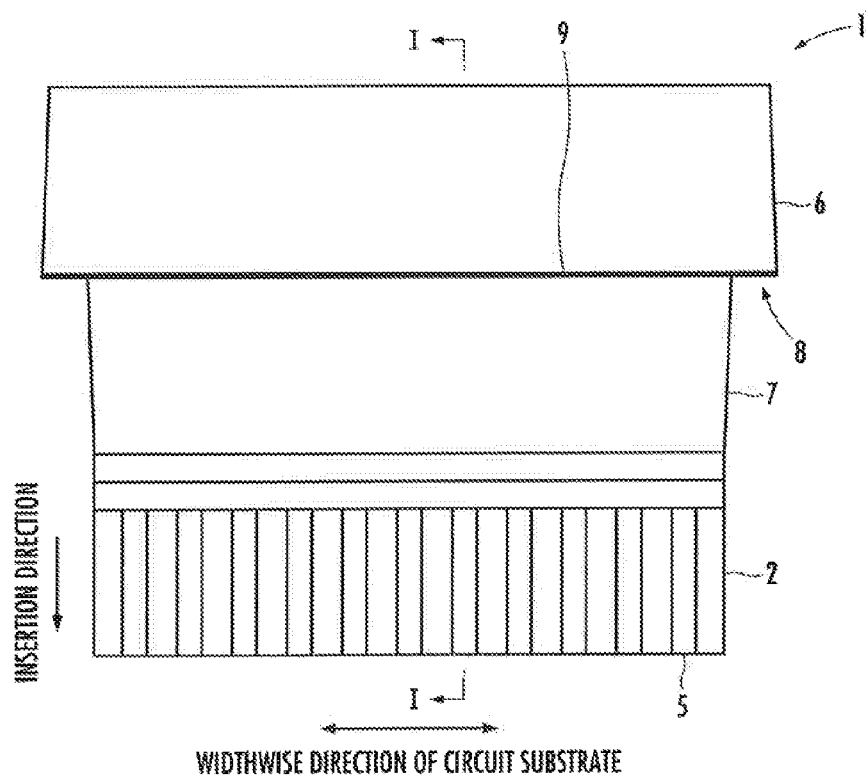
FIG. 1A is a plan view that illustrates the configuration of an electronic circuit device according to the present invention.
Figure 1B:
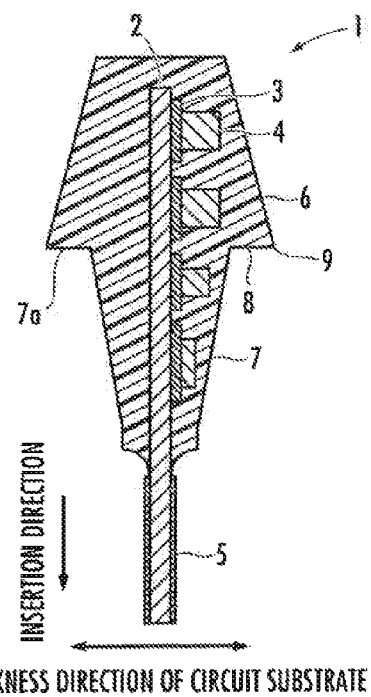
FIG. 1B is a schematic cross-sectional view taken along line I-I illustrated in FIG. 1A.

An electronic circuit device 1 according to this embodiment illustrated in FIG. 1, for example, is used for a card edge-type engine control unit (ECU) of a motorcycle and the like, and a circuit substrate 2 is sealed with a resin. In the circuit substrate 2, electronic components 4 are mounted on a pad 3, and a terminal section 5 is formed in an end portion in a predetermined direction (a direction for the insertion thereof into an insertion port 12 of a harness-side connector 11 illustrated in FIG. 2). The terminal section 5 is connected to the electronic components 4 through a wiring pattern not illustrated in the figure.

In addition, the electronic circuit device 1 includes a first resin sealing member 6 that seals an end portion disposed on the opposite side of the terminal section 5 and a second resin sealing member 7 that is arranged to be connected to the first resin sealing member 6. The second resin sealing member 7 seals a portion disposed between the first resin sealing member 6 of the circuit substrate 2 and the terminal section 5, and, as a result, the terminal section 5 protrudes from the second resin sealing member 7 so as to be exposed. Throughout the present specification and the claims, the first and second resin sealing members 6, 7, which are integrally connected together, may be referred to collectively as a resin body.

In the electronic circuit device 1, a level difference portion 8 is formed at a connection portion between the first resin sealing member 6 and the second resin sealing member 7, and a parting line 9 is formed on a peripheral end edge that is connected to the level difference portion 8 of the first resin sealing member 6.

Figure 2:
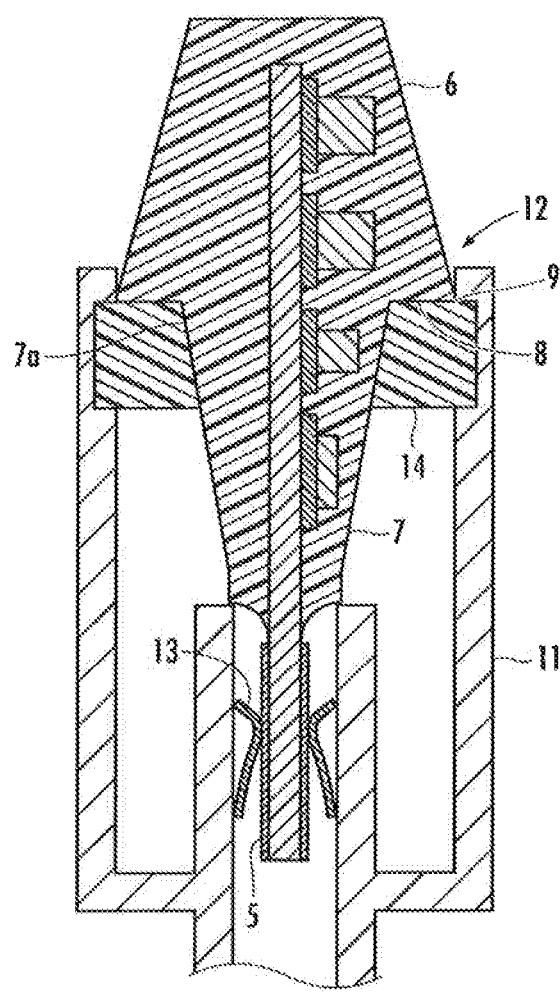
FIG. 2 is a schematic cross-sectional view that illustrates a state in which the electronic circuit device according to the present invention is connected to a connector.

As illustrated in FIG. 2, the electronic circuit device 1 is used by inserting the terminal section 5 into the insertion port 12 of the harness-side connector 11 to be connected to a connector-side terminal section 13. On the tip-end inner circumferential face of the insertion port 12, an endless sealing member 14 formed using a soft resin, synthetic rubber, or the like is arranged, and the terminal section 5 of the electronic circuit device 1 is connected to the connector-side terminal section 13, and at the same time the inside of the harness-side connector 11 is sealed, from the outside by the sealing member 14.

The sealing process described above is performed by bringing the sealing member 14 into tight contact with a surface 7a (first face) of the second resin sealing member 7 and fitting the electronic circuit device 1 to the end face of the sealing member 14 using the level difference portion 8 (second face). At this time, in the electronic circuit device 1, since the parting line 9 is included on the peripheral end edge connected to the level difference portion 8 of the first resin sealing member 6, the sealing member 14 can be brought into tight contact with the surface of the second resin sealing member 7 without traversing the parting line 9.

Accordingly, the electronic circuit device 1 can reliably block the penetration of external moisture to the inside of the harness-side connector 11 by using the sealing member 14. In addition, in the electronic circuit device 1, the level difference portion 8 is engaged with the end face of the sealing member 14, and accordingly, the waterproof property can be further improved.

In addition, the sealing member 14 is not limited to be configured to be arranged on the tip-end circumferential face of the insertion port 12 in advance but may be inserted into the insertion port 12 in the state of being fitted to the surface of the second resin sealing member 7. Furthermore, the electronic circuit device 1 is engaged with the harness-side connector 11 through a protruding portion, a hook portion, a hole portion, and the like not illustrated in the figure, whereby drop-out thereof from the harness-side connector 11 is prevented.

Next, a method for manufacturing the electronic circuit device 1 will be described with reference to FIG. 3.

Figure 3:
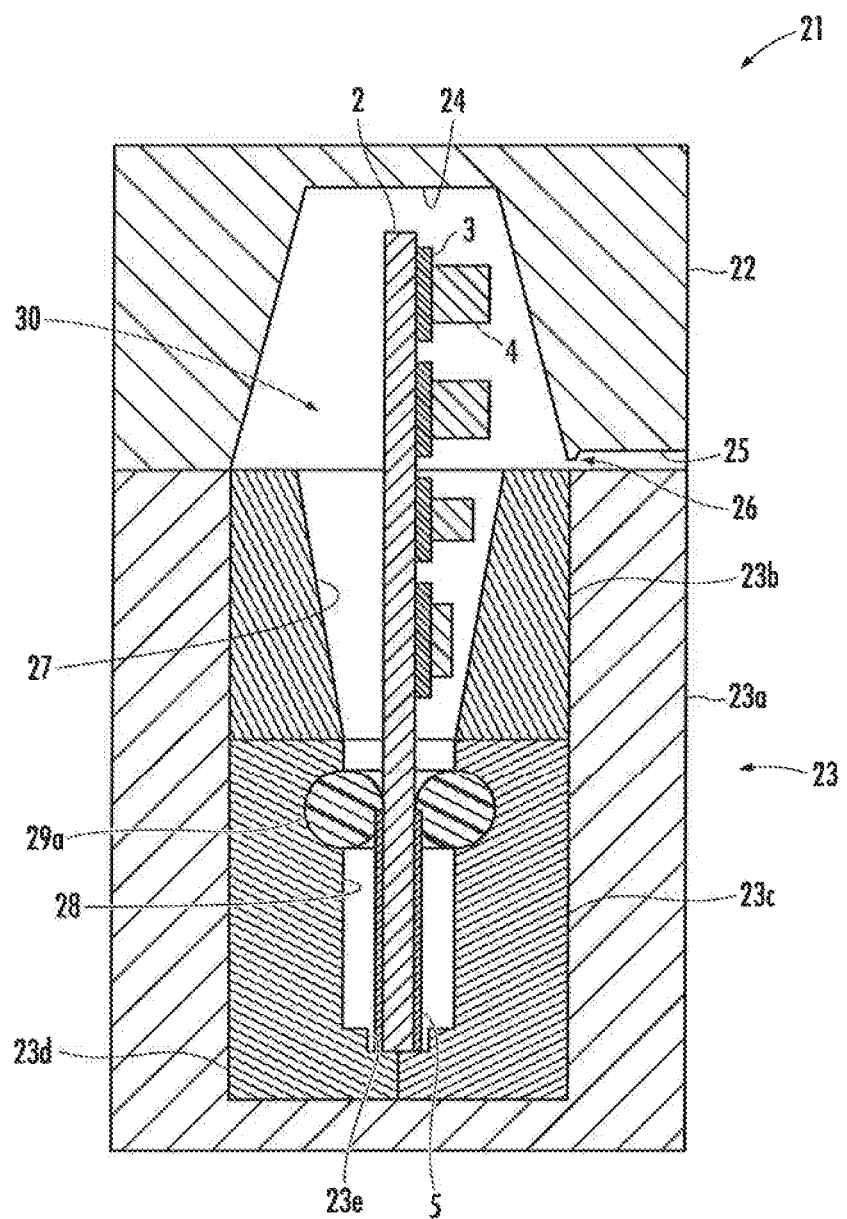
FIG. 3 is a schematic cross-sectional view that illustrates a method for manufacturing the electronic circuit device according to the present invention.

The electronic circuit device 1 can be manufactured using a metal mold apparatus 21 illustrated in FIG. 3. The metal mold apparatus 21 includes an upper die 22 as a first die and a lower die 23 as a second die. Here, the upper die 22 includes a first, hollow portion 24 having a shape following the external appearance of the first, resin sealing member 6 and a hollow portion that forms a runner 25 and a gate 26 between the lower die 23 and the upper die 22.

On the other hand, the lower die 23 includes: a first core 23b that forms a second hollow portion 27 having a shape following the external appearance of the second resin sealing member 7; and second and third cores 23c and 23d that form a third hollow portion 2$ that is arranged to be connected to the second hollow portion 27 and houses the terminal section 5 inside a lower die main body 23a. The second and third cores 23c and 23d are connected along the axial direction of the lower die main body 23a, thereby forming a third hollow portion 28 and forming a concave portion 23e into which the end portion of the circuit substrate 2 is inserted at the bottom of the third hollow portion 28.

In addition, in the end portion of the third hollow portion 28 that is disposed on the second hollow portion 27 side, an O-ring 29 as a support member is arranged. The O-ring 29, for example, is formed using rubber or the like having elasticity.

Here, the support member is not limited to the O-ring 29 but, for example, may be a member acquired by forming a through hole at the center of a plate-shaped member. In addition, the support member may be formed using plastic.

In the manufacturing method of this embodiment, first, in a state in which the upper die 22 and the lower die 23 are open, the terminal section 5 of the circuit substrate 2 is inserted into the third hollow portion 28, and the O-ring 29 is brought into tight contact with the terminal section 5 so as to support the circuit substrate 2 to be in a state in which the end portion of the circuit substrate. 2 disposed en the opposite side of the terminal section 5 points toward the upper the 22. In addition, the O-ring 29 may be brought into contact with the circuit substrate 2 at a further second hollow portion 27 side than the terminal section 5.

In addition, at this time, the tip end of the circuit substrate 2 is inserted into the concave portion 23e, and thus, the state in which the end portion disposed on the opposite side of the terminal section 5 points toward the upper die 22 inside the upper die 22 and the lower die 23 can be stably maintained.

Next, by clamping the upper the 22 and the lower die 23, a cavity portion 30 that is formed by the first hollow portion 24 and the second hollow portion 27 is formed. As a result, the circuit substrate 2 is arranged inside the cavity portion 30 in the state in which an end portion disposed on the opposite side of the terminal section 5 points toward the upper die 22. At this time, the inner circumferential face of the second hollow portion 27 is arranged so as to protrude to the inner side of the inner circumferential face of the first hollow portion 24 in a cross-sectional view.

Next, the cavity portion 30 is filled with a resin from the gate 26 through the runner 25. At this time, the O-ring 29 is arranged between the second hollow portion 27 and the third hollow portion 28, and the O-ring 29 is brought into tight contact with the terminal section 5, and accordingly, the resin is blocked by the O-ring 29 and does not penetrate into the third hollow portion 28. As a result, the electronic circuit device 1 that is in a state in which the terminal section 5 is exposed from the second resin sealing member 7 can be acquired.

In addition, the O-ring 29, as described above, may be brought into tight contact with the circuit substrate 2 on a further second hollow portion 27 side than the terminal section 5, and, similarly to a case where the O-ring 29 is brought into contact with the terminal section 5, the penetration of a molten resin into the third hollow portion 28 can be blocked.

Furthermore, at this time, the upper die 22 includes the first hollow portion 24 having the shape following the external appearance of the first resin sealing member 6, and the first core 23b of the lower die 23 includes the second hollow portion 27 having the shape following the external appearance of the second resin sealing member 7. As a result, the level difference portion 8 is formed on the boundary between the upper die 22 and the first core 23b, and the parting line 9 can be formed on the peripheral end edge on which the first resin sealing member 6 is connected to the level difference portion 8.

In the metal mold apparatus 21, the inner circumferential face of the second hollow portion 27 is arranged, so as to protrude to the inner side of the inner circumferential face of the first hollow portion 24 in a cross-sectional view, and accordingly, the level difference portion 8 can be advantageously formed. As a result, as described above, when the electronic circuit device 1 is connected to the harness-side connector 11, a contact area between the electronic circuit device 1 and the sealing member 14 can be increased by an amount corresponding to a contact between the level difference portion 8 and the end face of the sealing member 14, whereby the waterproof property can be improved.

Next, by holding the pressure of the metal mold apparatus 21, the resin is solidified. At this time, in the metal mold apparatus 21, since the circuit substrate 2 is supported to be in the state in which the end portion disposed on the opposite side of the terminal section 5 points toward the upper die 22, the area of the cross-section orthogonal to the mold opening direction of the cavity portion 30 is less than that of the cavity portion 32 of the conventional metal mold apparatus 31 illustrated in FIG. 4. Accordingly, when the internal pressure of the resin filled in the cavity portion 30 is the same as that of the resin filled in the cavity portion 32 of the metal mold apparatus 31, the upper die 22 and the lower die 23 can be maintained to be brought into contact with each other by using a force lower than that of the case of the metal mold apparatus 31.

Next, when the resin described above is solidified, the upper die 22 and the lower die 23 are opened, and the molded item is extracted, whereby the electronic circuit device can be acquired.

As a method for molding the first resin sealing member 6 and the second resin sealing member 7, a resin molding technique such as a transfer molding method using a thermosetting resin or an injection molding method using a thermoplastic resin that has been generally used conventionally may be used.

At this time, the O-ring 29 is arranged in the third hollow portion 28 and thus, remains in the third hollow portion 28. Thus, according to the manufacturing method of this embodiment, the O-ring 29 does not need to be fitted to each circuit substrate 2, and the O-ring 29 does not configure a part of the electronic circuit device 1, whereby the manufacturing cost of the electronic circuit device 1 can be reduced.

Figure 4:
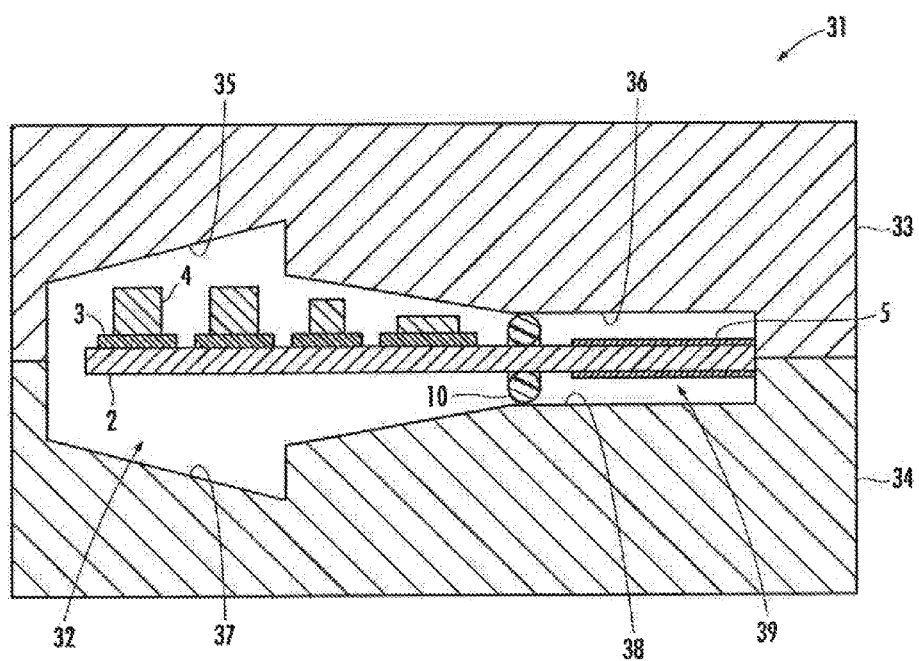
FIG. 4 is a schematic cross-sectional view that illustrates a conventional method for manufacturing an electronic circuit device.

On the other hand, in the conventional metal mold apparatus 31 illustrated in FIG. 4, the O-ring 10 is fitted to the circuit substrate 2 and is arranged in both of the upper die 33 side and the lower die 34 side and thus, cannot be configured to remain inside the metal mold apparatus 31. When the O-ring 10 is to forcibly remain inside the metal mold apparatus 31, the O-ring 10 is torn in the direction of separating the upper die 33 and the lower die 34 from each other when the mold is opened and thus cannot be reused.

In the metal mold apparatus 21 according to this embodiment, the upper die 22 may be divided into a plurality of parts and, for example, as illustrated in FIG. 3, may be horizontally divided into two parts at the center. The first hollow portion 24 included in the upper die 22 forms the first resin sealing member 6 and, as illustrated in FIG. 2, the sealing member 14 is not brought into contact with a thee of the first resin sealing member 6 that is disposed on an upper side than the parting line 9. Accordingly, by dividing the upper die 22, even when the parting line is formed on the surface of the first resin sealing member 6, the waterproof property of the sealing member 14 is not degraded.

On the other hand, the first core 23b of the lower die 23 cannot be divided into a plurality of parts. Since the second hollow portion 27 included in the first core 23b forms the second resin sealing member 7 with which the sealing member 14 is brought into tight contact, when the parting line is formed on the second resin sealing member 7 along the axial direction of the lower die main body 23a, for example, by horizontally dividing the first core 23b into two parts at the center illustrated in FIG. 3, there is concern that the waterproof property of the sealing member 14 is degraded. In contrast to this, in this embodiment, in a portion of the surface of the second resin sealing member 7 with which the sealing member 14 is brought into tight contact, a parting line extending in the direction in which the terminal section 5 is inserted is not formed, and accordingly, the waterproof property of the sealing member 14 on be sufficiently secured. The reason for this is that the portion of the surface of the second resin sealing member 7 with which the sealing member 14 is brought into tight contact is formed only along one die among a plurality of dies configuring the metal mold apparatus 21, in other words only along the first core 23b.

In addition, the electronic circuit device according to the present invention may be configured to have a plurality of sealing faces at mutually-different places in such a case, it is apparent that the mutually-different sealing faces may be molded by using the same metal mold among a plurality of metal molds configuring the metal mold, apparatus or by the mutually-different metal molds. Furthermore, it is apparent that the mutually-different sealing faces may be sealed by using a single sealing member.

EXPLANATIONS OF LETTERS OR NUMERALS

1 ELECTRONIC CIRCUIT DEVICE
2 CIRCUIT SUBSTRATE
4 ELECTRONIC COMPONENT
5 TERMINAL SECTION
6 FIRST RESIN SEALING MEMBER
7 SECOND RESIN SEALING MEMBER
7a FIRST FACE
8 LEVEL DIFFERENCE PORTION (SECOND FACE)
9 PARTING LINE
11 HARNESS-SIDE CONNECTOR
12 INSERTION PORT
21 METAL MOLD APPARATUS
22 UPPER DIE
23 LOWER DIE
30 CAVITY PORTION

The invention claimed is:

1. An electronic circuit device comprising:
a circuit substrate in which electronic components are mounted, and a terminal section is formed at an end portion of the circuit substrate in a predetermined direction; and
a resin body that is monolithically molded and seals the circuit substrate therein with the terminal section being exposed,
the resin body having a sealing face that extends around an axis of the predetermined direction and is configured to be brought into contact with an entire periphery of an inner circumferential face of an insertion port of a connector into which the terminal section is inserted, through a sealing member of the connector,
the resin body including a parting line that is formed as a trace of at least a pair of dies in monolithic molding of the resin body, the parting line substantially perpendicular to and extending around the axis of the predetermined direction.

2. The electronic circuit device according to claim 1, wherein the parting line is located at a position different from the sealing face.

3. The electronic circuit device according to claim 1, wherein the sealing face is molded inside of a single metal mold.

4. The electronic circuit device according to claim 1,
wherein the sealing face is configured to include a first face pointing to an outer peripheral side around the axis of the predetermined direction, and
wherein the resin body is configured to include a second face which contacts with an end edge of the first face disposed on an opposite side of the predetermined direction and points to the predetermined direction.

5. A method for manufacturing an electronic circuit device including:
a circuit substrate in which electronic components are mounted, and a terminal section is formed at an end portion of the circuit substrate in a predetermined direction;
and a resin body that is monolithically molded and seals the circuit substrate therein with the terminal section being exposed,
the resin body including a parting line that is formed as a trace of at least a pair of dies in monolithic molding of the resin body, the parting line substantially perpendicular to, and extending around an axis of the predetermined direction,
the resin body having a sealing face that extends around the axis of the predetermined direction and is configured to be brought into contact with an entire periphery of an inner circumferential face of an insertion port of a connector into which the terminal section is inserted, through a sealing member of the connector,
the method comprising:
a step of inserting the circuit substrate into a second die in a state in which a first die and the second die are open and supporting the circuit substrate to be in a state in which an end portion of the circuit substrate disposed on a side opposite to the predetermined direction points to the first die by using a metal mold apparatus including the first die that includes a first hollow portion having a shape following an external appearance of a half part of the resin body that is disposed on a side opposite to the predetermined direction and the second die that includes a second hollow portion having a shape following an external appearance of a half part of the resin body, which includes the sealing face, of the predetermined direction, the second die being configured by a single metal mold;
a step of forming a cavity portion that is formed by the first hollow portion and the second hollow portion by clamping the first die and the second die;
a step of filling the cavity portion with a resin, thereby forming said parting line; and
a step of opening the first die and the second die after the resin is solidified and extracting the electronic circuit device.

6. The electronic circuit device according to claim 1, wherein the electronic circuit device is used in an engine control unit of a two wheel vehicle.

7. The method for manufacturing an electronic circuit device according to claim 5, wherein the electronic circuit device is used in an engine control unit of a two wheel vehicle.

8. An electronic circuit device comprising:
a circuit substrate in which electronic components are mounted, and a terminal section is formed at a first end portion of the circuit substrate in a predetermined direction; and
a resin body that is formed integrally around the circuit substrate by monolithic molding to seal a second end portion of circuit substrate, the terminal section being exposed from the resin body,
wherein:
the resin body has a sealing face that extends around an axis of the predetermined direction and is configured to contact with an entire periphery of an inner circumferential face of an insertion port of a connector into which the terminal section is inserted, through a sealing member, and
the resin body includes a parting line that is formed as a trace of at least a pair of dies in monolithic molding of the resin body and which does not intersect with the sealing member at the sealing face.

* * * * *